United States Patent
Grollier et al.

(10) Patent No.: US 9,070,455 B2
(45) Date of Patent: Jun. 30, 2015

(54) MEMRISTOR DEVICE WITH RESISTANCE ADJUSTABLE BY MOVING A MAGNETIC WALL BY SPIN TRANSFER AND USE OF SAID MEMRISTOR IN A NEURAL NETWORK

(75) Inventors: Julie Grollier, Paris (FR); Vincent Cros, Paris (FR); Frédéric Nguyen Van Dau, Palaiseau (FR)

(73) Assignee: Centre National De La Recherche Scientifique—CNRS, Paris (FR)

( * ) Notice: Subject to any disclaimer, the term of this patent is extended or adjusted under 35 U.S.C. 154(b) by 659 days.

(21) Appl. No.: 13/318,119

(22) PCT Filed: Apr. 30, 2010

(86) PCT No.: PCT/EP2010/055902
§ 371 (c)(1),
(2), (4) Date: Mar. 9, 2012

(87) PCT Pub. No.: WO2010/125181
PCT Pub. Date: Nov. 4, 2010

(65) Prior Publication Data
US 2012/0163069 A1    Jun. 28, 2012

(30) Foreign Application Priority Data

Apr. 30, 2009 (FR) .................................... 09 02122

(51) Int. Cl.
*G11C 11/00* (2006.01)
*G11C 11/16* (2006.01)
(Continued)

(52) U.S. Cl.
CPC ............... *G11C 11/16* (2013.01); *G11C 11/14* (2013.01); *G11C 11/54* (2013.01)

(58) Field of Classification Search
CPC ........................................................ G11C 11/00
USPC ......... 365/48, 55, 62, 66, 74, 78, 80–93, 100, 365/130, 131, 148, 158, 171–173, 209, 213, 365/225.5, 230.07, 232, 243.5; 257/295, 257/421, 422, 427, E21.665, E27.006; 438/3; 977/933–935
See application file for complete search history.

(56) References Cited

U.S. PATENT DOCUMENTS 3,965,463 A * 6/1976 Chaudhari et al. .............. 365/34
4,887,236 A * 12/1989 Schloemann ................. 365/173
(Continued)

FOREIGN PATENT DOCUMENTS

WO        2006/064022 A1    6/2006

OTHER PUBLICATIONS

R. Standley Williams, "How We Found the Missing Memristor", Spectrum, Dec. 1, 2008, pp. 29-35, vol. 42, No. 12, IEEE, URL:http://ieeexplore.ieee.ort/stamp/stamp.jsp?tp=&arnumber=4687366, XP002569124.

(Continued)

*Primary Examiner* — Harry W Byrne
(74) *Attorney, Agent, or Firm* — Baker & Hostetler LLP

(57) ABSTRACT

A device with adjustable resistance includes two magnetic elements separated by an insulating or semi-conductor element. The resistance of the device depends on the position of a magnetic wall in one of the magnetic elements, the magnetic wall separating two areas of said magnetic element each having a separate homogeneous direction of magnetization. The device comprises means for moving the magnetic wall in the magnetic element by applying a spin-polarized electric current, such that the resistance of the device is adjustable in a continuous range of values. The invention is useful in neuromimetic circuits, neural networks and bio-inspired computers.

22 Claims, 8 Drawing Sheets

(a)    (b)

(51) Int. Cl.
*G11C 11/54* (2006.01)
*G11C 11/14* (2006.01)

(56) References Cited

U.S. PATENT DOCUMENTS

| | | | | |
|---|---|---|---|---|
| 5,695,864 | A * | 12/1997 | Slonczewski | 428/212 |
| 7,554,835 | B2 * | 6/2009 | Cowburn et al. | 365/158 |
| 2001/0026470 | A1 * | 10/2001 | Gillies et al. | 365/158 |
| 2003/0085413 | A1 * | 5/2003 | Wunderlich | 257/200 |
| 2004/0251232 | A1 * | 12/2004 | Chen et al. | 216/22 |
| 2004/0252538 | A1 * | 12/2004 | Parkin | 365/80 |
| 2004/0252539 | A1 * | 12/2004 | Parkin | 365/80 |
| 2005/0078509 | A1 * | 4/2005 | Parkin | 365/158 |
| 2005/0078511 | A1 * | 4/2005 | Parkin | 365/171 |
| 2005/0094427 | A1 * | 5/2005 | Parkin | 365/80 |
| 2006/0028866 | A1 * | 2/2006 | Parkin | 365/173 |
| 2006/0060989 | A1 * | 3/2006 | Morise et al. | 257/903 |
| 2006/0120132 | A1 * | 6/2006 | Parkin | 365/80 |
| 2006/0237808 | A1 | 10/2006 | Saito | |
| 2007/0047156 | A1 * | 3/2007 | Cowburn et al. | 360/324.1 |
| 2007/0242505 | A1 | 10/2007 | Ochiai et al. | |
| 2012/0250406 | A1 * | 10/2012 | Morise et al. | 365/173 |

OTHER PUBLICATIONS

Xiaobin Wang, et al., "Spintronic Memristor Through Spin-Torque-Induced Magnetization Motion", IEEE Electron Device Letters, Mar. 1, 2009, pp. 294-297, vol. 30, No. 3, IEEE Service Center, New York, NY, US, XP011251008.

Alireza Saffarzadeh, et al., "Quantum Theory of Tunneling Magnetoresistance in GaMnAs/GaAs/GaMnAs Heterostructures", Journal of Magnetism and Magnetic Materials, Oct. 1, 2006, pp. 141-146, vol. 305, No. 1, Elsevier Science Publishers, Amsterdam, NL, XP 024984924.

Dmitri B. Strukov et al.: "The missing memristor found," Nature, vol. 453, pp. 80-83, May 1, 2008.

J. Joshua Yang et al.: "Memristive switching mechanism for metal/oxide/metal nanodevices," Nature Nanotechnology, vol. 3, pp. 429-433, Jul. 2008.

J. Grollier et al.: "Switching a spin valve back and forth by current-induced domain wall motion," Applied Physics Letters, vol. 83, No. 3, pp. 509-511, Jul. 2003.

* cited by examiner

MEMRISTOR DEVICE WITH RESISTANCE ADJUSTABLE BY MOVING A MAGNETIC WALL BY SPIN TRANSFER AND USE OF SAID MEMRISTOR IN A NEURAL NETWORK

CROSS REFERENCE TO RELATED APPLICATION

This application is a National Stage of International patent application PCT/EP2010/055902, filed on Apr. 30, 2010, which claims priority to foreign French patent application No. FR 0902122, filed on Apr. 30, 2009, the disclosures of which are incorporated by reference in their entirety.

FIELD OF THE INVENTION

The present invention relates to an adjustable-resistance device, commonly called a memristor, that works through the movement of a magnetic wall by spin transfer. It is used for example in the field of chip-based neural network neuromimetic circuits and more generally in bio-inspired computer architecture.

BACKGROUND

In the last fifty years, purely digital Von Neumannian computing has progressed considerably. Nonetheless, even the most powerful computers using the most advanced algorithms are unable to quickly perform apparently simple processes, such as image interpretation, that are however performed in a fraction of a second by the human brain. The human brain indeed operates massively parallelly and analogically, unlike current computers. Chip-based analog neuromimetic circuits, which are intended to reproduce the operation of the human brain, make it possible to go beyond conventional architectures. Neural-network architectures work on the basis of learning methods: a circuit is caused to react in the desired manner to a given input. This is achieved by adjusting the values of the components of the circuit such as to converge on the desired output for a given input. Chip-based implementation therefore requires the use of nanometric, analog, reconfigurable and rapid components.

Until 2008, chip-based neuromimetic circuits were entirely built using transistors. Notably, several transistors were used to reproduce the plasticity of a single synapse connecting two neurons.

In 2008 however, the Hewlett-Packard team headed by Stanley Williams published several patents and articles proposing neural circuits built using one transistor per neuron and a "memristor" per synapse connecting two neurons (D. B. Strukov et al., Nature 453, 80 (2008) and J. J. Yang et al., Nature Nano. 3, 429 (2008)). A memristor is a nanometric resistor having a value configurable within a continuous range by the electric charge that previously crossed it. In the case of neural circuits, the main application thereof is to simulate the plasticity of synapses on a chip. A Hewlett-Packard memristor forms a structure comprising an insulating layer inserted between ordinary metal layers. By applying a current to the structure, oxygen vacancies are created, which migrate under the effect of the voltage and induce a resistance change. These memristors work on the basis of the effect of ion electromigration. Unfortunately, this ion electromigration effect involves high operating temperatures and therefore a potential fragility of the device. Above all, however, this ion electromigration effect results in low operating speeds, since it is related to the mobility of the ions: the resistance of Hewlett-Packard memristors changes very slowly.

This is why the applicant has turned to a technology radically different to the technologies used in known memristors, i.e. magnetoresistance. Indeed, the applicant has demonstrated in experiments that it is possible to move a magnetic wall in a magnetic element by spin transfer, in one direction or the other according to the sign of the current applied to the magnetic element. The applicant has notably measured this effect in spin valves, which are devices in which two magnetic layers are separated by a metal layer (J. Grollier et al., Appl. Phys. Lett. 83, 509 (2003)). Furthermore, it has recently been suggested (X. Wang et al., IEEE Electron Device Letters 30, 741 (2009)) that these spin valves could be used to make memristors. Surprisingly, this last publication gives no implementation details, since the realization of a memristor using a spin valve is difficult to imagine. This is because the memristive effect of the spin valves is negligible, because they provide limited magnetoresistance, about 10%. Consequently, a spin valve can only provide low-value resistance. This is why the realization of a memristor using a spin valve is difficult to envisage.

In 2005, the applicant filed international patent application WO 2006/064022 A1, which discloses a device having two magnetic elements separated by an insulating element. The device makes it possible to switch reproducibly between two stable magnetization states identifiable with logic states "0" or "1", thereby enabling the storage of information. Switching between two magnetization states is effected by moving a magnetic wall in one of the magnetic elements between two stable positions. Unfortunately, this device does not make it possible to continuously vary the resistance within a range, since the magnetic wall only has two stable positions to which they gravitate irremediably. It therefore only provides two resistance values, each corresponding to one of the two magnetization states. Consequently, it is not a memristor.

SUMMARY OF THE INVENTION

The invention is notably intended to provide a magnetoresistive memristor, i.e. a resistor having a value that may be adjusted within a wide and continuous range, using the movement of a magnetic wall by spin transfer. For this purpose, the invention relates to a device with adjustable resistance comprising two magnetic elements separated by an insulating element or semi-conductor. The resistance of the device depends on the position of a magnetic wall in one of the magnetic elements, the magnetic wall separating two areas of said magnetic element each having a separate homogeneous direction of magnetization. The device comprises means for moving the magnetic wall in the magnetic element by applying a spin-polarized electric current, such that the resistance of the device is adjustable in a continuous range of values.

The invention also relates to an adjustable-resistance device having a stack of two magnetic layers separated by an insulating or semi-conductor layer, the stack forming a bar. A first of the two magnetic layers comprises a magnetic wall separating two zones having homogeneous directions of magnetization substantially parallel to the longitudinal axis of the bar but in opposing directions. The magnetic wall is substantially perpendicular to the longitudinal axis of the bar. The second of the two magnetic layers has a homogeneous direction of magnetization substantially parallel to the longitudinal axis of the bar. The device comprises means for moving the magnetic wall in the first magnetic layer along the bar by applying a spin-polarized electric current, such that the resistance of the device changes within a continuous range of values as the magnetic wall moves along the bar.

In a preferential embodiment, the means for moving the magnetic wall along the bar may include at least two electrodes arranged on the first magnetic layer and/or on the second magnetic layer, said electrodes making it possible to apply the spin-polarized electric current to the bar.

Advantageously, the magnetic wall can only move along the bar if the spin-polarized current applied between the electrodes has a current density above a given threshold. Above this threshold, the amplitude of movement of the magnetic wall along the bar may vary linearly with the duration of application of the spin-polarized current between the electrodes. The sign of the spin-polarized current applied between the electrodes can determine the direction of movement of the magnetic wall along the bar.

The device may include a nucleation reservoir at one extremity of the bar, to facilitate the creation of the magnetic wall.

In one embodiment, the magnetic wall in the first magnetic layer may be situated at one extremity of the bar, the first layer then having a single homogeneous direction of magnetization substantially parallel to the longitudinal axis of the bar, such that the resistance of the device is equal to one of the limits of the continuous range of values. The device may then be used as excitatory synapse between two neurons in a neural network, the current applied to the bar making it possible to reduce the value of the resistance from the upper limit of the continuous range of values. The device may also be used as inhibitory synapse between two neurons, the current applied to the bar making it possible to increase the value of the resistance from the lower limit of the continuous range of values. The device may also include artificial traps for the wall, such as to reproduce synaptic functions.

For example, the first magnetic layer may be a ferromagnetic layer, such as a planar anisotropic magnetic material made of a NiFe alloy or a CoFeB alloy, or a perpendicular anisotropic magnetic material made of a CoPt alloy or of a FePt alloy, or a FePd alloy, or a Co/Ni stack, or a Co/Al$_2$O$_3$ stack.

For example, the two magnetic layers may be separated by an insulating layer containing aluminum oxide Al$_2$O$_3$ or magnesium oxide MgO. They may also be separated by a semiconductor layer containing gallium arsenide GaAs or a GaAs-based compound.

For example, the second magnetic layer may also be a ferromagnetic layer. It may notably contain cobalt, or a NiFe alloy, or a CoPt alloy, or a FePt alloy, or a FePd alloy, or a Co/Ni stack or a Co/Al$_2$O$_3$ stack. It may also contain a synthetic CoFeB/Ru/CoFeB antiferromagnetic.

The other main advantages of the invention are that, by using the effect of magnetoresistance, it provides a resistance having a value that can be adjusted quickly and up to very high values. Indeed, it has recently been demonstrated that a wall pushed by spin transfer can reach 175 m/s. This means that the resistance of a sub-micrometric memristor according to the invention based on spin transfer may be adjusted by current injection lasting several nanoseconds or less.

Finally, the invention limits the risk of deterioration of the component, because the current densities used to move the magnetic wall by spin transfer are less than $10^8$ A.cm$^{-2}$ (amps/cm$^2$), i.e. well below those used in electromigration techniques.

BRIEF DESCRIPTION OF THE DRAWINGS

Other features and advantages of the invention are disclosed in the description below in relation to the drawings attached, as follows.

DETAILED DESCRIPTION

Figure 1:
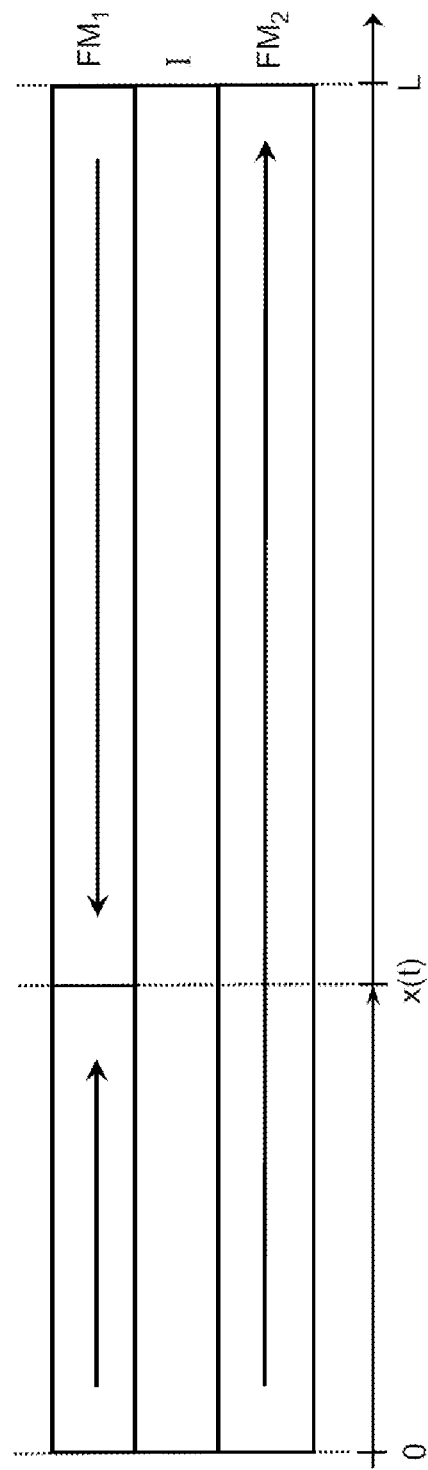
FIG. 1, which is a schematic drawing of an example magneto-resistive memristor according to the invention, FIG. 2, which contains two schematic drawings of an example magneto-resistive memristor according to the invention, used as a synapse in a neural network, FIG. 3, which is a perspective view of an example magneto-resistive memristor according to the invention in bar form, FIG. 4, which contains top views of several examples of magneto-resistive memristors according to the invention having complex forms, FIG. 5, which contains a side view and a top view of an example of command electrodes of a magneto-resistive memristor according to the invention, FIG. 6, which is a side view of an example magneto-resistive memristor according to the invention during writing of the initial state thereof, FIG. 7, which is a side view of an example magneto-resistive memristor according to the invention during reading of the resistance state thereof, FIG. 8, which is a side view of an example magneto-resistive memristor according to the invention during writing of a resistance state different to the initial state thereof.

FIG. 1 is a schematic diagram of an example magneto-resistive memristor according to the invention, comprising two magnetic elements FM$_1$ and FM$_2$ forming elongate layers of length L, the elements FM$_1$ and FM$_2$ being separated by a non-magnetic element I also forming an elongate layer of length L. The layer I is an insulant or a semi-conductor. The direction of magnetization of the two magnetic layers FM$_1$ and FM$_2$ are shown by arrows. Thus, in the case of FIG. 1, a magnetic wall is present in FM$_1$ at a position x which may vary over time t, while the magnetization is homogeneous in FM$_2$, which has no magnetic wall.

The resistance R of such a magneto-resistive structure is different depending on the arrangement of the magnetizations in the two layers. If the magnetizations are oriented in the same direction, the arrangement is referred to as "parallel", i.e. both arrows in the same direction in FIG. 1, and the resistance is noted as R=R$_P$. If the magnetizations are oriented in opposing directions, the arrangement is referred to as "antiparallel", i.e. the two arrows in opposing directions in FIG. 1, and the resistance is noted as R=R$_{AP}$. Thus, the resistance R of the structure is given by the following equation:

$$R = R_P \frac{x}{L} + R_{AP}\left(1 - \frac{x}{L}\right)$$

Advantageously, by injecting a spin-polarized current through the wall, it is possible to move the wall in one direction or in the other according to the sign of the current through the effect of spin transfer. Advantageously, for current densities above a critical value J$_c$ defined notably by the initial trapping of the wall, the propagation speed u of the wall by spin transfer is proportional to the current i injected according to u=γi, where γ is a given coefficient. Again advantageously, the wall does not move below J$_c$ (u=0) and the movement x at instant t is given by x(t)=γit=γq, where q is the total charge injected. The resistance of the device therefore depends on the charge and not just the current: this is the basis of the memory effect of the memristor. Thus, for a perfect sample with no trapping center, the "memristance" M as a function of the charge q is given by the following equation (1):

$$M(q) = R_{AP}\left[1 - \frac{R_{AP} - R_P}{R_{AP}}\frac{\gamma}{L}q\right]$$

Consequently, since the resistance of the device is a function of the charge, it is a multi-state device with resistance controllable by the charge injected, using wall movement by spin transfer. And if no current is applied, the device retains its last resistance value.

Figure 2:
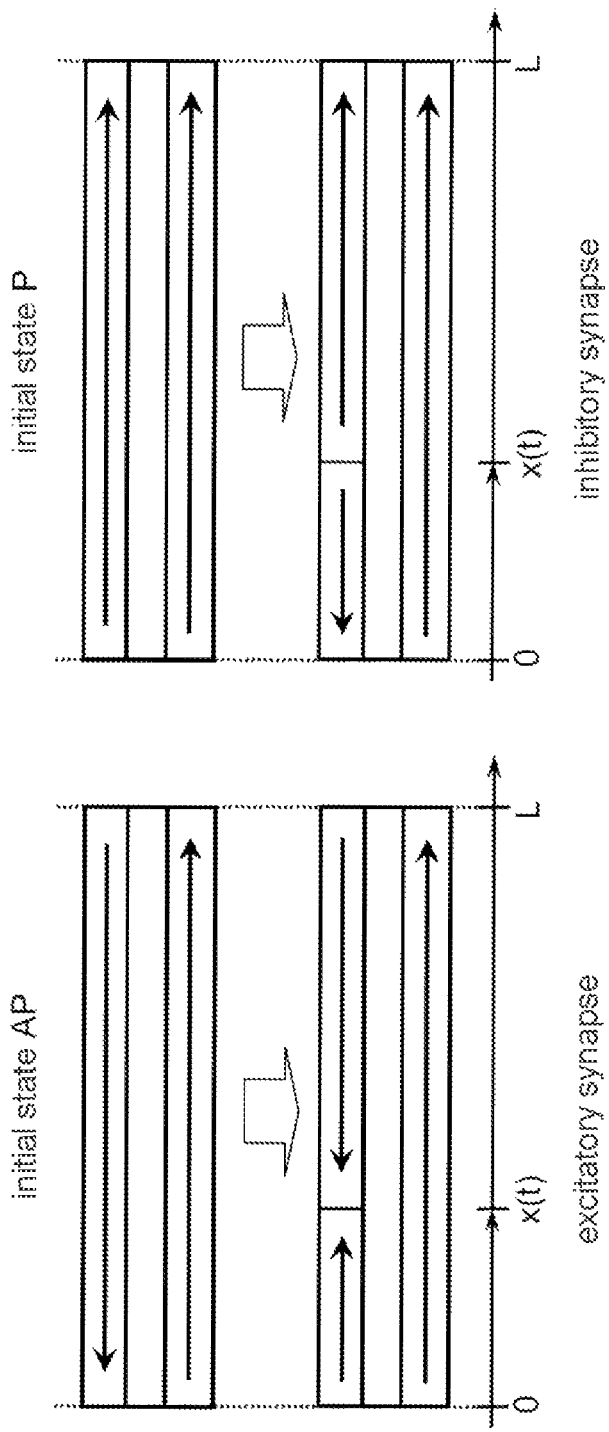

FIG. 2 shows schematically how a magneto-resistive memristor according to the invention can advantageously be used as a synapse in a neural network. Indeed, for a single polarity of the current injected, i.e. for a single direction of propagation of the magnetic wall, a magneto-resistive memristor according to the invention makes it possible to implement either an excitatory synapse or an inhibitory synapse. An excitatory synapse becomes more conductive the more it is used, while an inhibitory synapse becomes more insulating each time it is stimulated. Thus, as shown in FIG. 2 where $R_{AP} > R_P$, by simply changing the direction of the magnetization of the layer $FM_2$, the magneto-resistive memristor according to the invention can be used either as an artificial excitatory synapse, having an initial antiparallel state AP the resistance of which is reduced when a current is applied to it, or as an artificial inhibitory synapse, having an initial parallel state P the resistance of which increases when a current is applied to it. By changing the polarity of the current injected, it is also possible to switch from excitatory synapse behavior to inhibitory synapse behavior.

Figure 3:
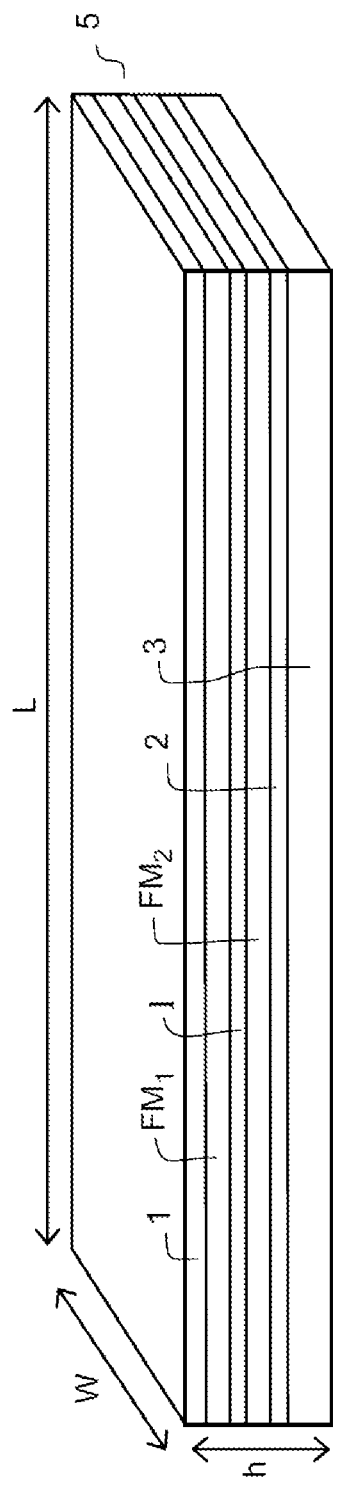

FIG. 3 is a perspective view of an example magneto-resistive memristor according to the invention in the form of a bar 5. The bar may be of length L which may vary from several hundred nanometers to several microns. The width w of the bar 5 may be around a hundred nanometers or less. The thickness h of the magnetic stack formed by the memristor may be around several tens of nanometers. A layer 1 advantageously forms a protective layer of the layer $FM_1$, typically Au, Ru, Ta or a more complex stack of these materials. The layer 1 may be omitted if the materials forming $FM_1$ so permit. The layer $FM_1$ may be a ferromagnetic layer where the magnetic wall is propagated. It may be a planar anisotropic material such as a NiFe or CoFeB alloy. To reduce the dimension of the wall to several tens of nanometers or less and therefore reduce L to around a hundred nanometers, perpendicular anisotropic materials may be used, such as CoPt, FePt, FePd alloys, or a stack of cobalt and nickel layers (stack hereinafter referred to as Co/Ni) or a stack of cobalt and aluminum dioxide layers (stack hereinafter referred to as $Co/Al_2O_3$). Layer I may be an insulant or a semi-conductor material. Indeed, the magneto-resistive effect used by the invention is the tunnel magnetoresistance effect, which may reach 600%, in order to maximize the amplitude of variation of the resistance between $R_P$ and $R_{AP}$ and thereby enlarge the range of resistance. If I is an insulant, it may for example be a tunnel barrier such as $Al_2O_3$ or MgO. If I is a semi-conductor, it may for example be GaAs. The layer $FM_2$ is a ferromagnetic layer having fixed magnetization. It may for example be a simple Co, NiFe, CoPt, FePt, FePd, CoNi or $CoAl_2O_3$ ferromagnetic, or a synthetic CoFeB/Ru/CoFeB antiferromagnetic. Layer 2, which may be omitted, advantageously forms a layer enabling the $FM_2$ magnetization to be trapped, typically an anti-ferromagnetic material such as IrMn, PtMn or CoO. Layer 3 advantageously forms a buffer layer that may be useful for a correct growth of the materials, typically Ta, Ru or a more complex stack of the two.

Figure 4:
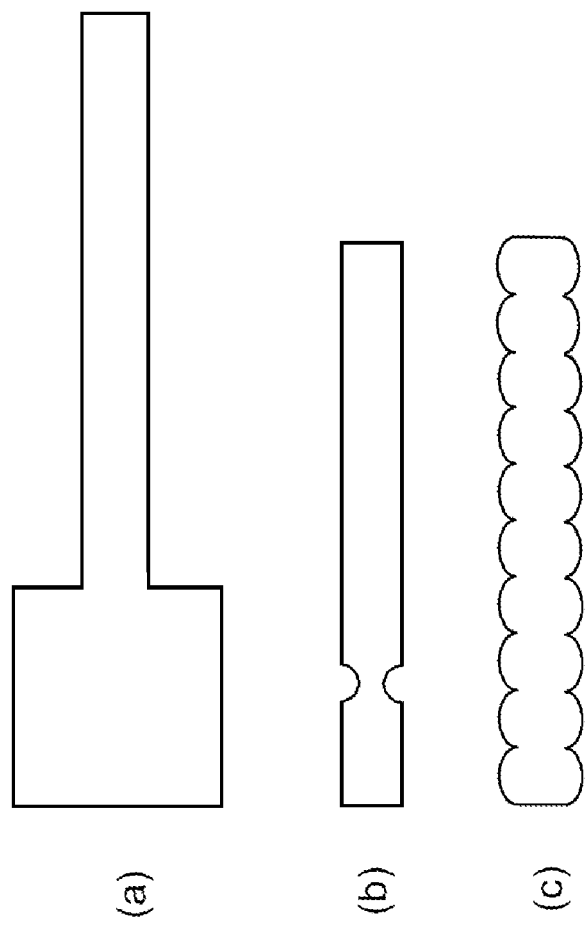

FIG. 4 shows top views of several examples of magneto-resistive memristors according to the invention having more complex forms. Indeed, a nucleation reservoir may be used to facilitate the creation of the wall, as shown schematically in example (a) of FIG. 4. To obtain memristors that are more complex than the one in the equation (1) and therefore to reproduce synaptic functions, artificial traps for the magnetic wall may be included in a controlled manner, as shown schematically by examples (b) and (c) of FIG. 4.

Figure 5:
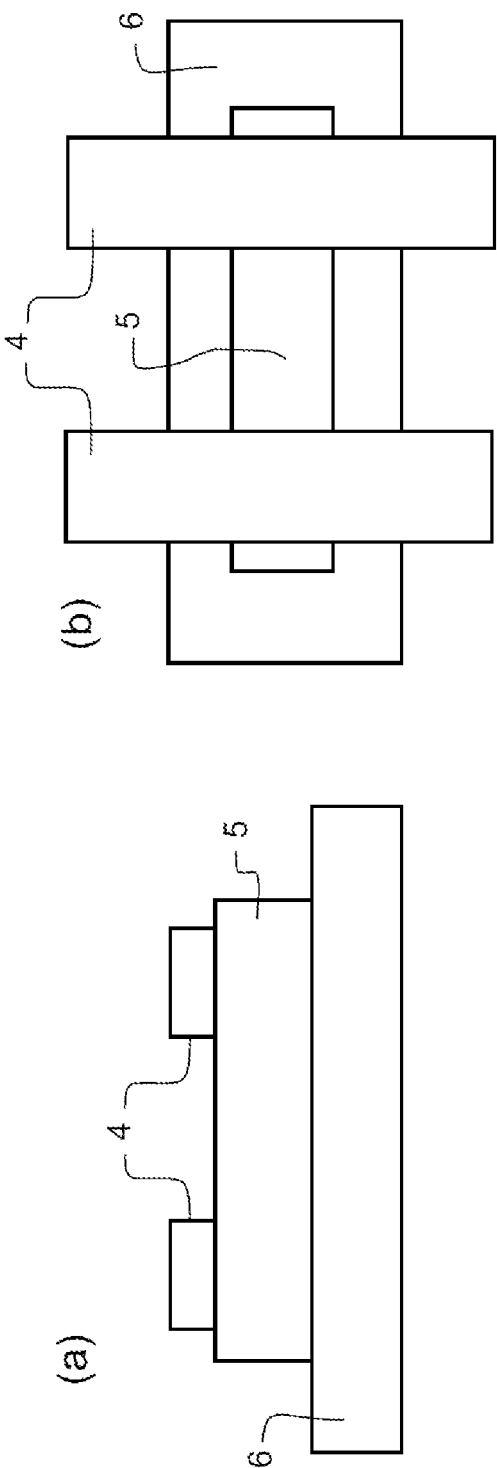

FIG. 5 shows a side view (a) and a top view (b) of the same example magneto-resistive memristor according to the invention in the form of a bar 5 as shown in FIG. 3, but also showing command electrodes for writing then reading the resistance state. Electrodes 4 may advantageously be located at the top of the memristor, which may include other electrodes like the electrodes 4. An electrode 6 may advantageously be located at the bottom of the memristor.

Figure 6:
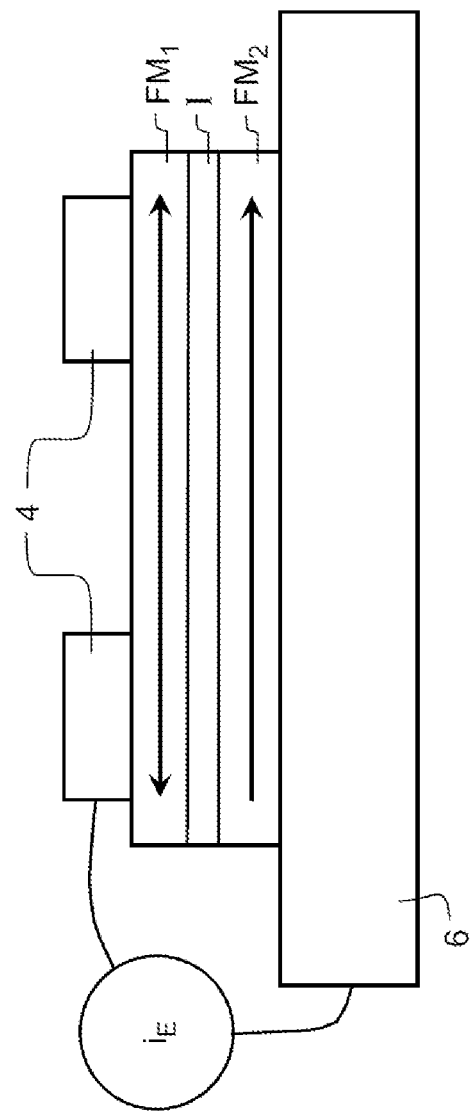

FIG. 6 is a side view of the same example magneto-resistive memristor according to the invention in the form of a bar as shown in FIGS. 3 and 5, during writing of the initial state. The initial state is either the parallel state P of the magnetizations for an inhibitory synapse, or the antiparallel state AP for an excitatory synapse. This initial state may be controlled by vertical spin transfer by applying a current $i_E$ between the electrodes 4 and 6. Depending on the polarity of the current $i_E$ injected and for a sufficiently high current density $i_E$, around $10^7$ A.cm$^{-2}$, a spin transfer torque sets the state P or the state AP.

Figure 7:
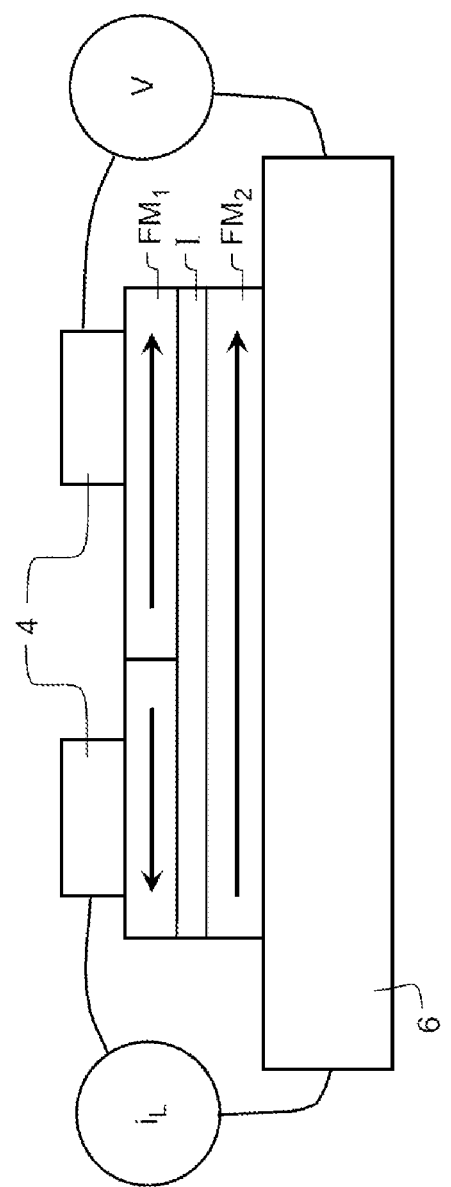

FIG. 7 is a side view of the same example magneto-resistive memristor according to the invention in the form of a bar as shown in FIGS. 3, 5 and 6, during reading of the resistance state. The resistance state is read by measuring the voltage V between the electrodes 4 and 6. To do so, a current $i_L$ that is sufficiently weak not to disturb the magnetic configuration ($i_L \ll i_E$) is also injected between the electrodes 4 and 6.

Figure 8:
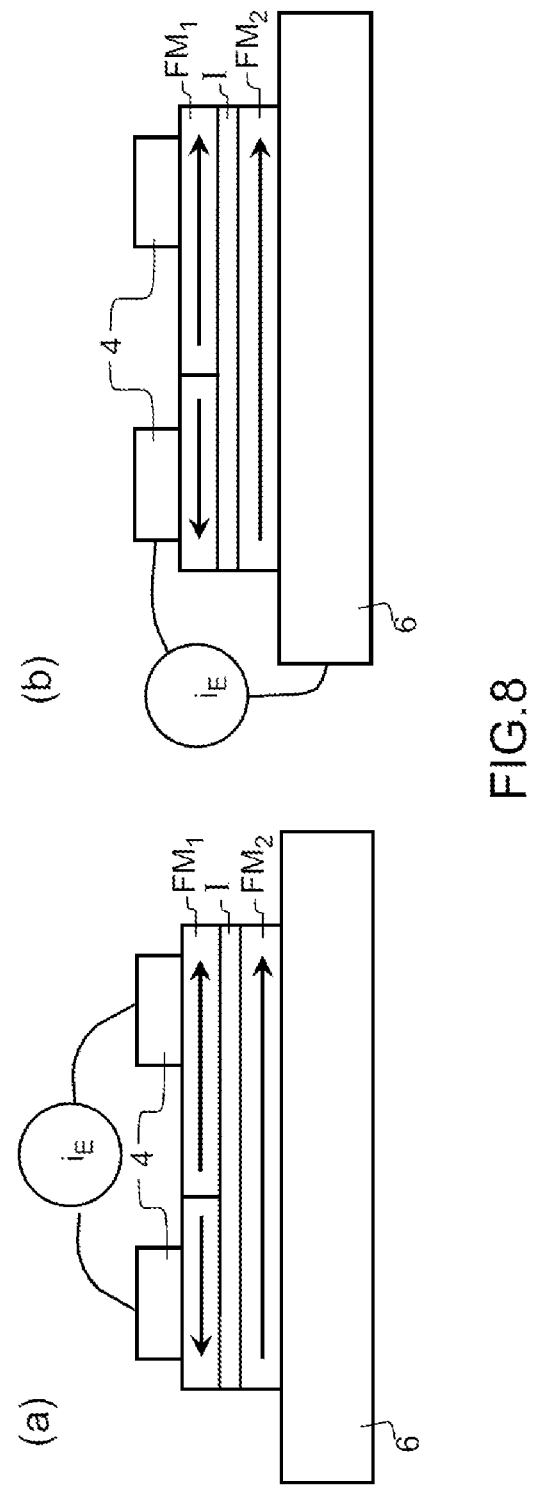

FIG. 8 is a side view of the same example magneto-resistive memristor according to the invention in the form of a bar as shown in FIGS. 3, 5, 6 and 7 during writing of a resistance state different to the initial state, also by moving the wall by spin transfer. Thus, after writing the initial state, subsequent writing may be effected in two different ways. A first technique involves applying the current $i_E$ laterally between the electrodes 4, as shown in example (a) of FIG. 8. A second technique involves injecting the current $i_E$ vertically between the electrodes 4 and 6 as shown in example (b) of FIG. 8.

Another principle advantage of a memristor according to the invention described above is that, even when it is off, it conserves the resistance value it had at the time it was turned off.

The invention claimed is:
1. A method for adjusting resistance in a device, wherein the device comprises two magnetic elements ($FM_1$, $FM_2$) separated by an insulating element or semi-conductor (I), the resistance of the device being dependent on the position of a magnetic wall in one of the magnetic elements ($FM_1$), the magnetic wall separating two areas of said magnetic element each having a separate homogeneous direction of magnetization, said device including means for moving the magnetic wall in said magnetic element ($FM_1$) by applying a spin-polarized electric current ($i_E$), the method comprising:
 injecting the spin-polarized current ($i_E$) through the magnetic wall;

moving the magnetic wall in a continuous range between a minimum resistance and a maximum resistance; and
continuously adjusting the resistance in the device,
wherein the minimum resistance is determined when magnetization directions of the two magnetic elements ($FM_1$, $FM_2$) are parallel with respect to each other and the maximum resistance is determined when the magnetization directions of the two magnetic elements ($FM_1$, $FM_2$) are opposite with respect to each other.

2. A method for adjusting resistance in an adjustable-resistance device comprising a stack of two magnetic layers separated by an insulating or semi-conductor layer (I), the stack forming a bar, a first of the two magnetic layers ($FM_1$) comprising a magnetic wall separating two zones having homogeneous directions of magnetization substantially parallel to the longitudinal axis of the bar but in opposing directions, the magnetic wall being substantially perpendicular to the longitudinal axis of the bar, the second of the two magnetic layers ($FM_2$) having a homogeneous direction of magnetization substantially parallel to the longitudinal axis of the bar, said device comprising means for moving the magnetic wall in the first magnetic layer ($FM_1$) along the bar by applying a spin-polarized electric current ($i_E$), the method comprising:
injecting the spin-polarized current ($i_E$) through the magnetic wall;
moving the magnetic wall in a continuous range between a minimum resistance and a maximum resistance; and
continuously adjusting the resistance in the device,
wherein the minimum resistance is determined when magnetization directions of the two magnetic layers ($FM_1$, $FM_2$) are parallel with respect to each other and the maximum resistance is determined when the magnetization directions of the two magnetic layers ($FM_1$, $FM_2$) are opposite with respect to each other.

3. The method as claimed in claim 2, wherein the means for moving the magnetic wall along the bar include at least two electrodes arranged on the first magnetic layer ($FM_1$) and/or on the second magnetic layer ($FM_2$), said electrodes making it possible to apply the spin-polarized electric current ($i_E$) to the bar.

4. The method as claimed in claim 3, wherein the magnetic wall can only move along the bar if the spin-polarized current ($i_E$) applied between the electrodes has a current density above a given threshold.

5. The method as claimed in claim 4, wherein, above the given current density threshold, the amplitude (x) of movement of the magnetic wall along the bar varies linearly with the duration of application (t) of the spin-polarized current ($i_E$) between the electrodes.

6. The method as claimed in claim 3, wherein the sign of the spin-polarized current ($i_E$) applied between the electrodes determines the direction of movement of the magnetic wall along the bar.

7. The method as claimed in claim 2, wherein it includes a nucleation reservoir at one extremity of the bar, to facilitate the creation of the magnetic wall.

8. The method as claimed in claim 2, wherein the magnetic wall in the first magnetic layer ($FM_1$) is situated at one extremity of the bar, the first layer ($FM_1$) having a single homogeneous direction of magnetization substantially parallel to the longitudinal axis of the bar, such that the resistance of the device is equal to one of the limits of the continuous range of values.

9. The method as claimed in claim 8, wherein it is used as excitatory synapse between two neurons in a neural network, the spin-polarized current ($i_E$) applied to the bar making it possible to reduce the value of the resistance from the upper limit of the continuous range of values.

10. The method as claimed in claim 8, wherein it is used as inhibitory synapse between two neurons in a neural network, the spin-polarized current ($i_E$) applied to the bar making it possible to increase the value of the resistance from the lower limit of the continuous range of values.

11. The method as claimed in claim 9, wherein it includes artificial traps for the wall, such as to reproduce synaptic functions.

12. The method as claimed in claim 2, wherein the first magnetic layer ($FM_1$) is a ferromagnetic layer.

13. The method as claimed in claim 12, wherein the ferromagnetic layer contains a planar anisotropic magnetic material.

14. The method as claimed in claim 13, wherein the planar anisotropic material contains a NiFe alloy or a CoFeB alloy.

15. The method as claimed in claim 12, wherein the ferromagnetic layer contains a perpendicular anisotropic magnetic material.

16. The method as claimed in claim 15, wherein the perpendicular anisotropic material contains a CoPt alloy, or a FePt alloy, or a FePd alloy, or a Co/Ni stack, or a Co/$Al_2O_3$ stack.

17. The method as claimed in claim 2, wherein the two magnetic layers ($FM_1$, $FM_2$) are separated by an insulating layer (I) containing aluminum oxide $Al_2O_3$ or magnesium oxide MgO.

18. The method as claimed in claim 2, wherein the two magnetic layers ($FM_1$, $FM_2$) are separated by a semi-conductor layer (I) containing gallium arsenide GaAs or a GaAs-based compound.

19. The method as claimed in claim 2, wherein the second magnetic layer ($FM_2$) is a ferromagnetic layer.

20. The method as claimed in claim 19, wherein the ferromagnetic layer contains cobalt, or a NiFe alloy, or a CoPt alloy, or a FePt alloy, or a FePd alloy, or a Co/Ni stack, or a Co/$Al_2O_3$ stack.

21. The method as claimed in claim 19, wherein the ferromagnetic layer contains a synthetic CoFeB/Ru/CoFeB anti-ferromagnetic.

22. The method as claimed in claim 2, wherein the device retains a resistance value when the device is turned off.

* * * * *